United States Patent [19]

George

[11] 4,333,163
[45] Jun. 1, 1982

[54] BUBBLE MEMORY WITH INCREASED GAP TOLERANCE BETWEEN PROPAGATION ELEMENTS

[75] Inventor: Peter K. George, Morgan Hill, Calif.

[73] Assignee: National Semiconductor Corporation, Santa Clara, Calif.

[21] Appl. No.: 143,593

[22] Filed: Apr. 25, 1980

[51] Int. Cl.³ .............................................. G11C 19/08
[52] U.S. Cl. ....................................................... 365/43
[58] Field of Search ............................. 365/39, 43, 41

[56] References Cited

U.S. PATENT DOCUMENTS

| | | | |
|---|---|---|---|
| 3,815,107 | 6/1974 | Almasi | 365/39 |
| 3,940,631 | 2/1976 | Bailey | 365/43 |
| 4,094,004 | 6/1978 | Dimyan | 365/43 |
| 4,094,006 | 6/1978 | Dimyan | 365/39 |
| 4,156,935 | 5/1979 | Bullock | 365/39 |
| 4,176,404 | 11/1979 | Dimyan et al. | 365/43 |

OTHER PUBLICATIONS

IEEE Transactions on Magnetics—Vol—Mag—12, No. 6 Nov. 1976 pp. 651-653.

Primary Examiner—James W. Moffitt
Attorney, Agent, or Firm—Brown & Martin

[57] ABSTRACT

In a bubble memory, propagation elements are configured so that shorts between adjacent elements as a result of fabrication inaccuracies do not destroy their poles and create barriers to bubble propagation. In designing the bubble memory, the gaps can thus approach the resolution limit of the photolithography, resulting in a higher storage density and a reduced operating drive field. In one embodiment permalloy chevrons which overlie a garnet film have opposing side edges defining a gap therebetween which increases in width moving in a direction away from the poles.

9 Claims, 9 Drawing Figures

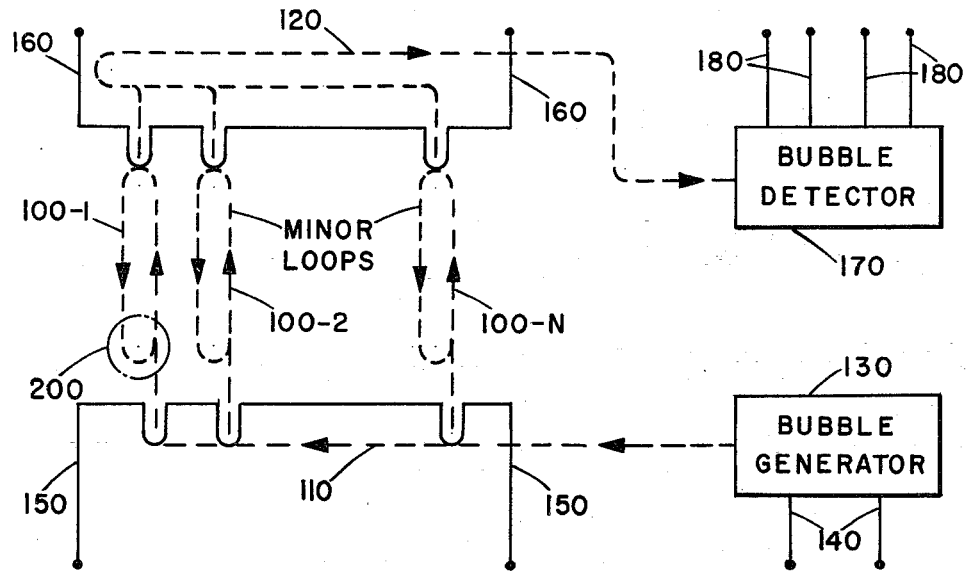
Fig. 8
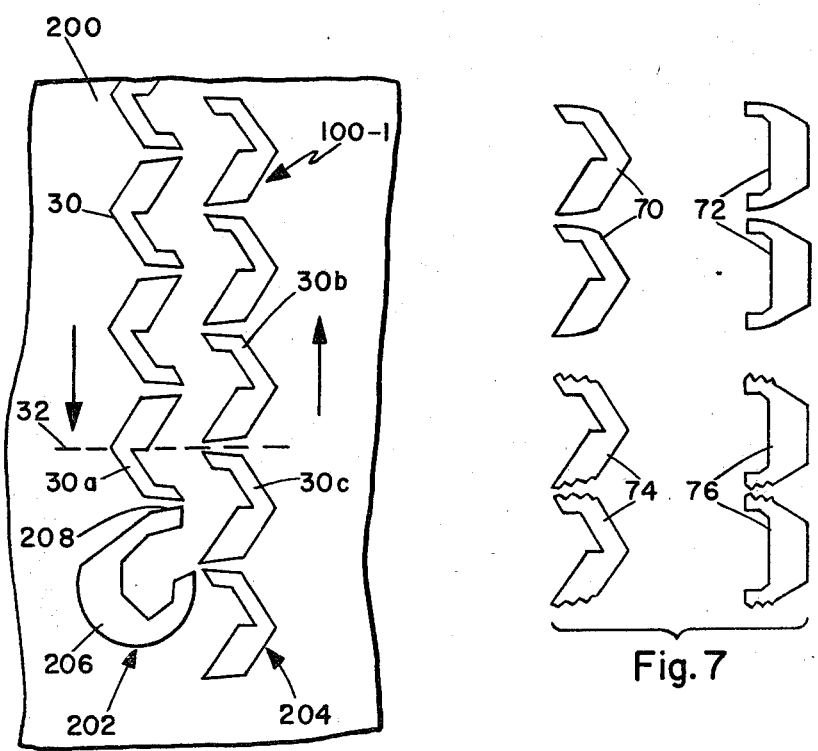
Fig. 9
Fig. 7

BUBBLE MEMORY WITH INCREASED GAP TOLERANCE BETWEEN PROPAGATION ELEMENTS

BACKGROUND OF THE INVENTION

The present invention relates to magnetic bubble memories, and more particularly, to a magnetic bubble memory having an increased storage density and a reduced operating drive field achieved through increasing the gap tolerance between adjacent bubble propagation elements.

Information storage and retrieval in conventional magnetic bubble memory devices is accomplished and measured by the presence or absence of magnetic bubble domains which are propagated and manipulated on a chip. Typically, the chip includes a plurality of spaced apart permalloy propagation elements which overlie a thin film of garnet. The maintenance and propagation of the magnetic bubble domains along the paths of the propagation elements is accomplished through the utilization of an in-plane rotating magnetic field (XY drive field) in the presence of a bias magnetic field (Z bias field.) As the drive field rotates the bubbles jump between adjacent propagation elements crossing the gaps which exist therebetween.

Heretofore the permalloy propagation elements have assumed a wide variety of configurations. In the beginning T-I bar configurations and Y-bar configurations were widely used. These are described in a publication entitled "Magnetic Bubble Technology: Integrated-Circuit Magnetics for Digital Storage and Processing," edited by Hsu Chang, IEEE Press, 1975 Library of Congress catalog No. 73-87653, pages 20–24, beginning with the paragraph entitled "Field Access Devices-Rotating Planar Field."

In the prior mentioned T-I and Y-bar patterns, the minimum feature size, that is the smallest dimension in the pattern, which in these patterns is the gap between the T-I or Y-bars, is approximately $\frac{1}{3}$ to $\frac{1}{2}$ of the bubble diameter. Since the resolution limit of current photolithography used in the fabrication processes of forming the overlays is somewhere between 1 to 1.5 microns, the smallest bubble diameter that can be used with these patterns is generally about 4.0 microns.

Presently by far the most utilized bubble propagation element configurations are the so-called half-disk or C-bar and the assymmetric chevron. The former configuration is described in an article entitled "Gap Tolerant Bubble Propagation Circuits" written by I. S. Gergis, P. K. George, and P. Kobayashi, and published in the IEEE Transactions on Magnetics, Vol. MAG-12, No. 6, November, 1976 pages 615–653. The latter configuration is described in an article entitled "The Development of Bubble Memory Devices," Electro 77 Paper 12/1, written by A. H. Bobeck.

The half-disk and assymmetric propagation configurations are sometimes referred to as being "gap tolerant." Their main advantage lies in the fact they have a minimum feature size, i.e. the gap between opposing legs of adjacent elements, which is approximately $\frac{2}{3}$ of the bubble diameter. Therefore, for a selected bubble size, e.g. 3.0 microns, the gap can be 2.0 microns. The utilization of the half-disk and assymmetric configurations leads to less stringent photolithographic accuracy than the utilization of earlier configurations. In addition with the half-disk and assymmetric chevron configurations, it is possible, by maintaining more stringent photolithographic accuracy, to design a magnetic bubble memory with a smaller bubble size than was previously possible before the introduction of these configurations. The operating drive field is relatively low for small bubbles. A reduction in the magnitude of the operating drive field results in lower power dissipation which results in both power savings and cost savings in the drive field circuitry. A review of various gap tolerant propagation element configurations can be found in a book entitled *Magnetic-Bubble Memory Technology*, by Hsu Chang, 1978, Marcel Dekker, Inc. Publisher, pages 52–56.

Heretofore, with known propagation element configurations including the half-disk and assymmetric chevron, a short between proximate permalloy elements has created a barrier to bubble propagation. The existence of too many shorts in a given chip has required that the chip be discarded. However, with the half-disk and assymmetric chevron propagation elements small bubbles sizes can be utilized with gap sizes significantly larger than the resolution limit of the photolithography. Therefore such bubble memories can be fabricated with a minimum number of shorts resulting from tolerance variations due to fabrication inaccuracies.

Clearly the bit storage capacity on a bubble memory chip is directly proportional to the gap size. If the gap size can be made smaller, both the number and size of the information storage loops which can be placed within a given chip area can be increased. In summary, it is the size of the gaps between adjacent propagation elements which limits the size of the magnetic bubble domains and thus the storage density of the device.

Heretofore, every known permalloy pattern has incorporated linear arrays of spaced apart propagation elements which have been configured and positioned to present opposing, parallel side edges. Both the half-disk and assymmetric chevron configurations each include a pair of legs. When delineated over the garnet, the legs of adjacent half-disk or chevron elements have been positioned so that their opposing side edges are parallel, the gap therebetween having a uniform width throughout the side dimension of the adjacent elements. Thus, if a short has occurred between adjacent elements it has typically resulted from the legs of adjacent elements overlapping one another. Such a short is referred to herein as a "wide short" since it exists throughout the entire side dimension of the adjacent elements. Such a wide short carries a considerable amount of flux and it effectively destroys the poles of the propagation elements. This creates a barrier and impedes the propagation of the magnetic bubbles down the pathway of elements containing the short. Thus, due to the resolution limit of current photolithography there has been an artificial lower limit on the gap size and thus an artificial upper limit on the storage density of prior magnetic bubble memories. This is especially understandable when one considers that the major portion of the area of a bubble memory chip is typically devoted to information storage loops comprised of either the half-disk or assymmetric chevron propagation elements.

U.S. Pat. No. 4,094,004 discloses a magnetic bubble expander-detector circuit for a magnetic bubble memory. This patent recognizes that gap tolerance between adjacent propagation elements in effect places an artificial lower limit on the size of the magnetic bubbles and an artificial upper limit on the density of the device. However, the patent further states that the elimination of the gaps alone will not suffice to eliminate these artificial limits since it is asserted that this would destroy necessary propagation directionality. The invention disclosed in this patent eliminates the horizontal gap between adjacent chevron propagation elements in the expander-detector pattern of the bubble memory detector circuit. However, a vertical gradient or vertical gap between the parallel side edges of adjacent chevron elements is substituted for the horizontal gap which has been eliminated (see FIG. 3.) This vertical gap is imparted by an underlying silicon dioxide wedge 74 as seen in FIG. 3. Clearly, the disadvantage of this construction is that the formation of precise wedges would be difficult to say nothing of the possible deleterious effects that might result from having propagation elements inclined with respect to the drive and bias fields.

SUMMARY OF THE INVENTION

The present invention takes advantage of a heretofore unexploited phenomenon. Specifically, shorts between adjacent permalloy propagation elements will not impede bubble propagation provided that the shorts occur in the proper places and do not effectively short out the desired poles. If a short occurs between adjacent half-disk or assymmetric chevron propagation elements in the localized vicinity of their poles it will not unduly degrade the desired performance of the elements. By decreasing the gap in a region where potential shorts will not hinder propagation, greater variations in gap widths can be tolerated. In accordance with the present invention, the opposing side edges of adjacent propagation elements are configured so that they are non-parallel. For example, they may diverge from their poles in straight, curved, step-like or some other suitable configuration.

As a result of the present invention, the gap between adjacent propagation elements can effectively be made smaller than normal without concern for the effects of shorting. Stating it another way, for small bubble devices where the gaps approach the resolution limit of the photolithography, "being on the small side" as a result of a fabrication inaccuracy will not necessarily destroy the operability of the resulting bubble propagation patterns. In effect, using the type of non-uniform gap as disclosed herein allows more latitude in exposure and ion-milling conditions. This latitude comes from the removal of small shorts as a catastrophic failure mode. The basic idea is to reduce the gap in areas where it will improve propagation but not hinder propagation if a short occurs.

The propagation element configurations disclosed herein result in a reduced drive field and an increased margin. Since smaller gap and bubble sizes can be utilized, the information storage density can be increased beyond present ranges. Furthermore, since the deleterious effect of permalloy shorts is effectively eliminated, overall chip yield is increased.

Accordingly, it is an object of the present invention to provide an improved magnetic bubble memory.

Another object of the present invention is to provide a magnetic bubble memory which has less severe gap tolerance and which has a relatively low drive field and an improved margin.

A still further object of the present invention is to provide a magnetic bubble memory in which the information storage loops consist of a plurality of permalloy propagation elements arranged in end to end fashion and wherein the opposing side edges of adjacent propagation elements are non-parallel and configured so that potential shorts will not hinder bubble propagation.

A still further object of the present invention is to provide a process of fabricating a magnetic bubble memory which will result in greater chip yield and reduced defects due to permalloy shorts.

BRIEF DESCRIPTION OF THE DRAWINGS

FIG. 7 shows further examples of propagation elements configured and positioned in accordance with the present invention.

FIG. 8 is a schematic circuit of a bubble memory constructed in accordance with the present invention.

FIG. 9 is an enlarged fragmentary view of a portion of the memory of FIG. 8.

Like reference numbers throughout the figures refer to like parts. The relative dimensions in the figures are not to scale.

DESCRIPTION OF THE PREFERRED EMBODIMENTS

Figure 1:
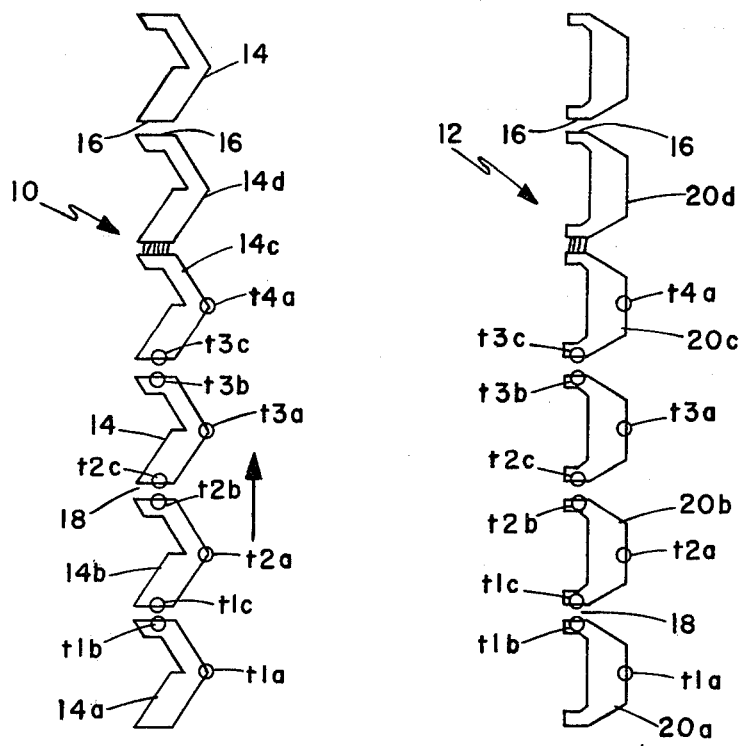
FIG. 1 shows two examples of prior art bubble propagation paths utilizing chevron and half-disk propagation elements, respectively.

Referring to FIG. 1, there are shown therein examples of conventional bubble propagation paths 10 and 12 each formed of a linear sequence of like, spaced apart permalloy propagation elements which overlie a layer of garnet not shown. Path 10 is made up of a plurality of assymmetric chevrons 14. These chevrons are positioned and configured so that the opposing side edges 16 of adjacent chevrons 14 and these gaps have a uniform width throughout the side dimension of the chevrons.

Figure 2:
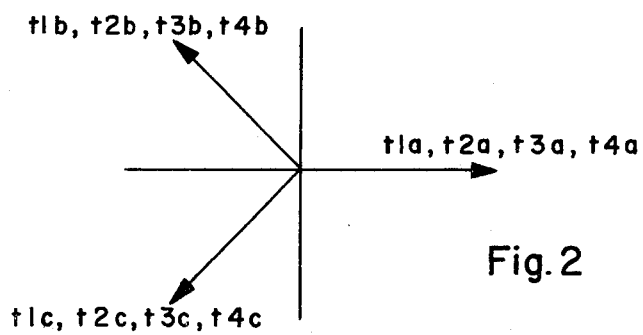
FIG. 2 correlates the position of a rotating magnetic drive field with the position of a magnetic bubble in each of the paths of FIG. 1.

Next consider how the serial propagation path 10 operates. FIG. 2 shows the position of a rotating magnetic drive field at various time instances t1a, t1b, t1c, t2a, t2b, and so on. Time instances t1a, t1b, and t1c, occur in one rotation of the magnetic drive field; time instances t2a, t2b, and t2c occur in another rotation of the drive field, etc. Referring back to path 10 of FIG. 1, the propagation of a single magnetic bubble domain in the direction indicated by the arrow is illustrated by a small circle. The various circles are labeled with designations t1a, t1b, etc., to indicate the position of the bubble during the various time instances of the rotation of the magnetic filed depicted graphically in FIG. 2. Inspection of FIG. 1 shows that on complete revolution of the magnetic drive field moved the bubble between corresponding positions on successive chevrons.

As the bubble approaches one of the gaps 18, the bubble comes under the influence of two strong parallel poles which cause it to stretch across the gap. The bubble then shrinks away from its original position as the field rotates. It is known that bubbles will stretch across parallel poles spaced apart a distance of a bubble radius or more.

However, due to fabrication inaccuracies, it is not uncommon for two adjacent chevrons to short as shown in the case of chevrons 14c and 14d of path 10 in FIG. 1. Because the opposing side edges of adjacent chevrons are parallel any short which occurs is necessarily substantially over the entire distance of the side dimension. As previously discussed, this creates a wide short. Such a short effectively inhibits further bubble propagation therebeyond, rendering this pathway inoperable.

The foregoing discussion regarding the pathway 10 also applies to the pathway 12 which is made of a plurality of spaced apart half-disk propagation elements 20 arranged in linear fashion. The reference numerals 16 and 18 are also utilized in connection with the pathway 12 to indicate the opposing side edges and gaps respectively. It can be seen that when a short occurs in the pathway 12, such as between the half-disk elements 20c and 20d, propagation of bubbles therebeyond is inhibited. Typically, the shorts which occur between adjacent half-disk elements are also wide shorts.

Figure 4:
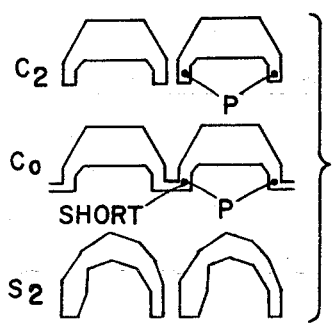
FIG. 4 shows certain ones of the propagation element configurations evaluated in the graph of FIG. 3.

As previously mentioned, the present invention takes advantage of the fact that shorts between adjacent propagation elements will not create barriers against bubble propagation, provided that the shorts occur in the proper place on the elements so that they do not effectively short out the desire poles. This principle exemplified by the margin data represented graphically in FIG. 3. The graph represents a comparison between a number of conventional bubble propagation patterns comprised of known elements configurations with a pattern made of unconventional half-disk elements Co shown in FIG. 4. The Co elements have a shorted gap in the vicinity of the poles at P.

Figure 3:
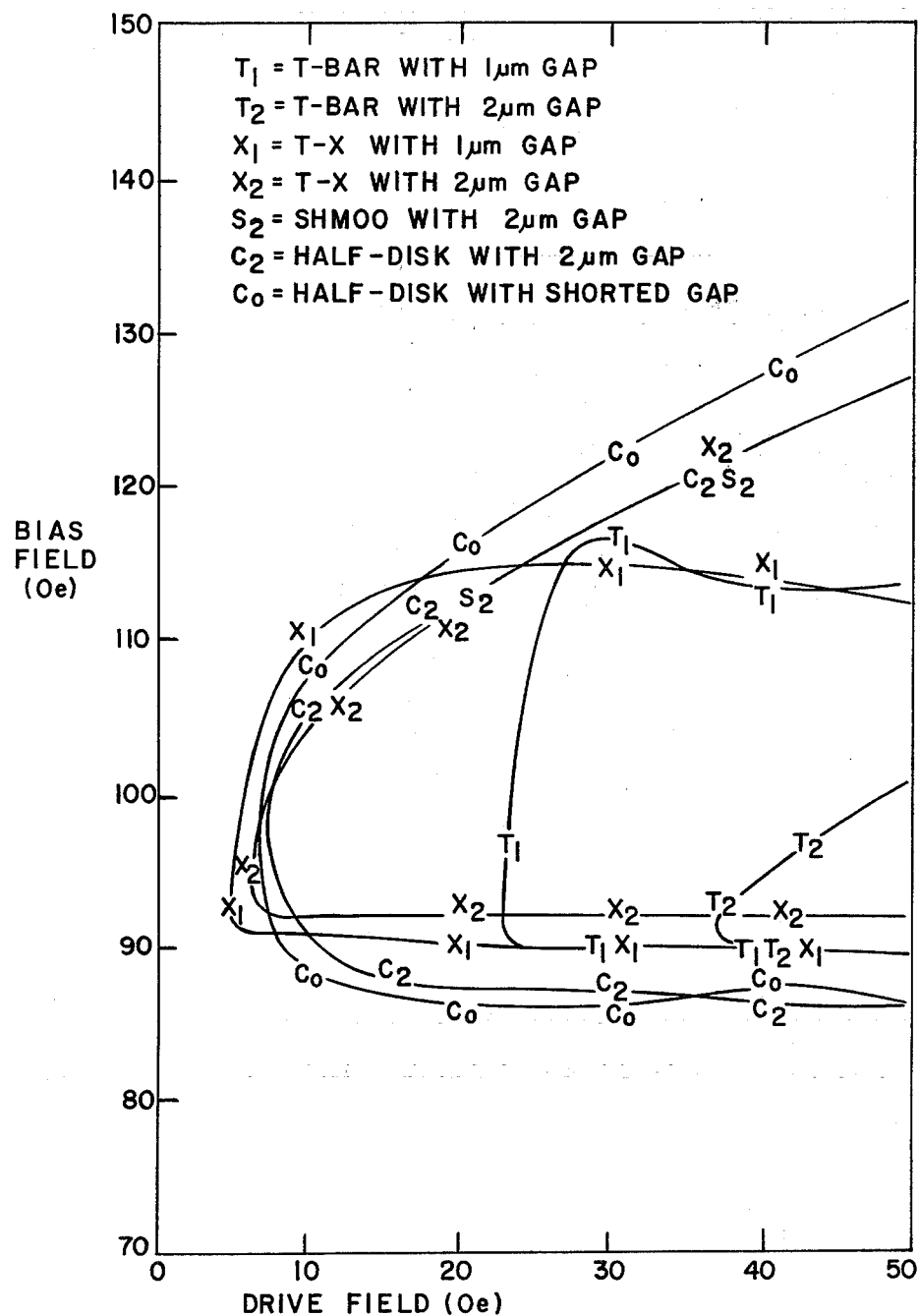
FIG. 3 is a graph depicting margin data for various magnetic bubble propagation element configurations.

As is well-known in the field, typical margin curves such as those shown in FIG. 3 are generally C-shaped. The vertical distance between the ends of a given C-shaped curve represents the Z-bias range between which a bubble can exist. Below the lower limit the bubble strips out and above the higher limit the bubble vanishes. A wide Z-bias range is desired since it permits packaging flexibility. Furthermore, the curved intermediate portion of a given C-shaped margin curve represents the minimum range of the magnitude of the required drive field. As previously mentioned, it is desirable to reduce the operating drive field since this results in less power dissipation in the drive field coils.

Thus by inspecting the graph of FIG. 3, it is clear that the pattern consisting of the Co shorted elements is superior overall. Unfortunately, the linewidth of the short in this pattern is only 1 micron which is below the nominal 2 micron resolution normally used in connection with the assymmetric chevron or half-disk propagation patterns. On the other hand, this data suggest that if a short occurs in either an asymmetric chevron or half-disk element near the remote ends of their legs performance will not be degraded and in fact may in some instances be improved.

Figure 5:
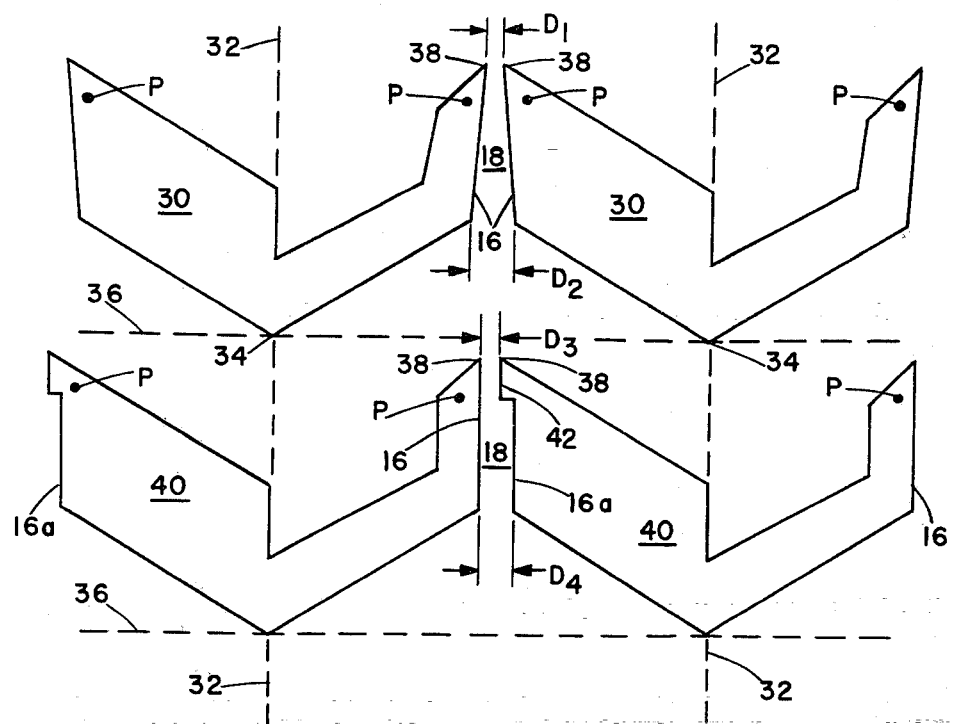
FIG. 5 shows two pairs of adjacent assymmetric chevron bubble propagation elements which are configured and positioned in accordance with the present invention to define non-uniform gaps therebetween.

Referring to FIG. 5, there are illustrated therein two pairs of chevrons propagation elements representing two different configurations according to the teachings of the present invention. The chevrons 30 are configured so that their opposing side edges 16 extend linearly outwardly from their respective axes 32. Putting it another way, their side edges diverge in a direction moving towards the peaks 34 of the chevrons when the chevrons are positioned so that their axes 32 are parallel and a line 36 intersecting their peaks extends perpendicularly to the axes. The width of the gap 18 thus increases linearly in a direction moving away from the poles. It can thus be seen that the gap 18 has a non-uniform width throughout the side dimension of the chevron 30. Normally, a magnetic bubble memory incorporating the chevron 30 is designed so that gaps such as 18 will exist between adjacent chevrons. If, however, due to inaccuracies resulting during the photolithographic fabrication process a short should occur between adjacent chevrons of this configurations, it will typically occur near the remote tips 38. In all but extreme instances, a predominate number of such shorts which do occur will extend over a very minor portion of the opposing side edges. Prototypes actually fabricated with chevrons of this type have demonstrated that such small shorts do not effectively short out the poles P. Therefore bubble propagation between such shorted elements is not impeded. Theoretically, it is believed that the explanation for this phenomenon is that such small shorts carry only minimum flux. The short saturates and thus behaves as though it were not there. The desired poles are retained. By way of example, the distance $D_1$ may be approximately 1.5 microns and the distance $D_2$ may be approximately 2.5 microns for bubbles measuring 3.0 microns.

Also shown in FIG. 5 are chevrons 40 of another modified configuration in accordance with the present invention. Here each of the chevrons 40 has a conventional straight edge 16 which is parallel to the respective axes 32 of the chevrons. The other side edge 16a has a stepped configuration. A minor portion of the side edge 16a adjacent to the tip 38 extends farther from the axis 32 of the chevron on the right than the remaining portion, each of the portions being parallel with the axis. Thus in a bubble memory having propagation paths formed of the chevrons 40, the predominate number of the shorts which do occur will be small shorts, and will essentially consist of a junction of the portion 42 of one of the chevrons 40 with the tip portion of an adjacent chevron. Such shorts will not effectively short-out the poles of the chevrons and thus bubble propagation between the chevrons, if they are shorted out, is not inhibited. By way of example, the distance $D_3$ between the tip portions of chevrons 40 may be approximately 1.5 microns and the distance $D_4$ may be approximately 2.5 microns for bubbles measuring 3.0 microns.

It will be noted that with each of the chevron configurations shown in FIG. 5, the minimum feature size may be approximately 1.5 microns which is above current resolution limit of photolithography. This is below the normal 2 micron resolution limit normally used in connection with the fabrication of bubble propagation elements for 3.0 micron bubbles. The configurations of FIG. 5 increase the gap tolerance. They allow more latitude in exposure and ion-milling conditions. The vast majority of propagation shorts which do occur will not destroy the bubble propagation path. Clearly, the overall result is an increase in chip yield. It will be noted that in rare instances, major fabrication errors may occur in which the opposing side edges of both the propagation elements shown in FIG. 5 will be joined throughout their entire length creating a wide short and impeding bubble propagation. For 2.0 micron bubbles, $D_1$ and $D_3$ may each measure approximately 1.0 micron, and $D_2$ and $D_4$ may each measure approximately 1.25 to 1.50 microns.

With the configurations shown in FIG. 5, the gap has been reduced in areas where it will improve bubble propagation. Thus smaller bubbles can be utilized, and information storage density can be increased. The gap can be made wider in areas where it will not affect bubble propagation, i.e. away from the tips, and thus the likelihood of shorts will be further reduced. In addition with the non-uniform gap configurations of the FIG. 5 it has been determined that a lower operating drive yield is required. This improves the margin of the magnetic bubble memory and results in lower power dissipation in the drive field coils. This enables the drive field electronics to be integrated on a single chip and thus reduces the cost of the memory. This reduction in the required drive field make it unnecessary to use more expensive discrete components in fabricating the drive field electronics.

Figure 6:
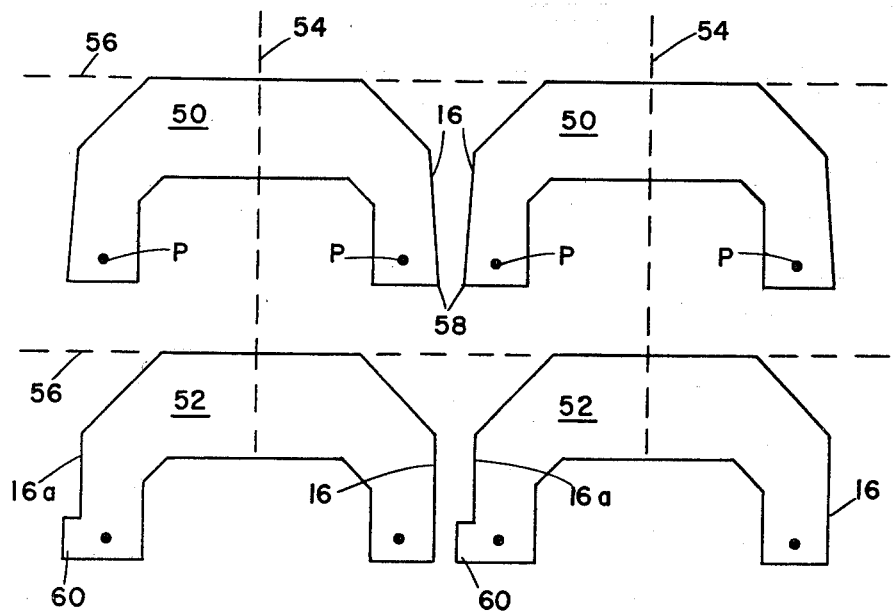
FIG. 6 shows two pairs of adjacent half-disk bubble propagation elements which are configured and positioned in accordance with the present invention to define non-uniform gaps therebetween.

Referring now to FIG. 6, there are shown therein two pairs 50 and 52 of half-disk propagation elements which have been modified in accordance with the teachings of the present invention. Their side edges incorporate the same concepts of the modified chevrons shown in FIG. 5 and discussed above. The configuration of the elements 50 is analogous to that of the elements 30 (FIG. 5.) In regard to the elements 50, the opposing side edges 16 extend linearly outwardly from the respective axes 54 when adjacent elements are positioned so that their axes are parallel and a line 56 intersecting their peaks extends perpendicular to the axes. The predominate number of shorts which occur are small shorts adjacent to the tip 58.

The configuration of the elements 52 shown in FIG. 6 is analogous to that of the elements 40 (FIG. 5). Each half-disk element 52 has one straight edge 16 and one stepped edge 16a. The edge 16 is parallel to the axes 54. The edge 16a has a major portion which is parallel to the axes 54 and stepped portion 60 which juts outwardly away from the axes. Thus the predominate amount of shorts that occur are small shorts. A bubble memory incorporating the half-disk elements 50 or 52 shown in FIG. 6 will have the same advantages of gap tolerance, increased chip yield, increased storage density, and lower drive field in comparison to conventional bubble memories incorporating the standard half-disk propagation elements.

Referring to FIG. 7, there are shown therein a plurality of asymmetric chevrons and half-disk propagation elements which have been modified in accordance with the present invention. In the chevrons 70 and half-disk elements 72, the opposing side edges diverge from one another in curved fashion. In the chevrons 74 and half-disks 76 the opposing side edges diverge from each other in saw tooth fashion. It will be understood that the foregoing concepts of the present invention are not limited to incorporation in the standard asymmetric chevron and half-disk elements but could be incorporated into any bubble propagation pattern wherein adjacent bubble propagation elements define pairs of poles and have opposing side edges which must be close enough to permit a bubble to jump therebetween.

Having described details of the invention, a specific example of a block replicate bubble memory architecture (FIG. 8) incorporating the concepts herein disclosed will be described. Broadly, a serial-parallel bubble propagation path is used to transfer bubbles into the minor loops and a parallel-serial bubble propagation path is used to transfer bubbles from the minor loops. The bubbles are written into the minor loops and read therefrom in response to control signals applied to the memory.

As is conventional, the major portion of the chip area of the bubble memory device is devoted to the minor loops. For example, in a one megabit bubble memory chip measuring approximately 0.400 inches on a side, the information storage area made of minor loops may measure approximately 0.370 inches on a side. In this area, it is desirable to utilize bubble propagation elements in accordance with the present invention in order to increase information storage density while at the same time minimizing the number of permalloy shorts.

Around the peripheral area of the chip are the bubble generator, the bubble detector, and the various propagation pathways for carrying bubbles to and from the storage area. The period of the propagation elements, i.e. the length from one tip of an element to the other tip, and the gap between adjacent elements can be made much larger in the peripheral area of the chip. It is possible to expand the period and the gap in the peripheral area because the function of the peripheral paths is to transfer a stream of bubble and non-bubble positions rapidly and not to store a long stream. With a larger period and gap the field produced in the permalloy which drives the bubbles is stronger. Since the gap is relatively large in the peripheral area, permalloy shorts are no problem there. By way of example, the period and gap in the peripheral area may be 20–24 microns and 2.0 microns, respectively for 3.0 micron bubbles versus 16 microns and 1.5 microns respectively on the storage area.

Reference should now be made to FIG. 8 where a bubble memory constructed in accordance with the present invention is illustrated in schematic fashion. This memory includes plurality of minor loops 100-1, 100-2 . . . 100-N. Magnetic bubbles are propagated into these loops in the direction indicated by the arrows in response to a rotating magnetic field imparted by current flowing through suitable coils wound about the chip.

Also included in the bubble memory of FIG. 8 is a serial-parallel input propagation path 110, and a parallel-serial output propagation 120. Paths 110 and 120 respectively provide means for inputting bubbles into the minor loops and means for outputting bubbles from the minor loops.

In operation, bubbles are generated in a serial fashion on path 110 by a bubble generator 130. The generator produces the bubbles in response to the application of external signals applied on a pair of bubbles generator control lines 140. Then the rotating magnetic field propagates the stream of bubbles interspersed with no bubbles in position along the serial portion path 110 until the bubble and no bubble positions of the stream are suitably aligned with various parallel inputs to the minor loops. Subsequently, in response to an external signal applied to a transfer-in control line 150, the bubbles propagate along the parallel inputs to the minor loops. In this fashion, the minor loops are loaded with streams of binary information represented by a stream of bubble and non-bubble positions.

Similarly in response to the application of an external signal to a transfer-out control line 160, one bubble from each of the minor loops is made to propagate along the parallel portion of path 120. These bubbles are subsequently merged in serial fashion creating a stream of bubble and non-bubble positions along the serial portion of the path 120. The bubbles on this path are then serially propagated to a bubble detector 170 which operates to generate signals representative of the presence or absence of a bubble as the stream of data from path 120 is fed thereto. These output signals are applied to putput lines 180.

The bubble memory illustrated schematically in FIG. 8 may be constructed with conventional materials. For example, the propagation elements may be made of permalloy or similar material overlying a thin magnetic film of orthoferrite or garnet.

Referring to FIG. 9, there is illustrated in simplified form a portion 200 of one of the minor loops 100-1 shown schematically in FIG. 8. As shown in FIG. 9, the minor loop consists of a plurality of asymmetric chevron propagation elements 30 configured with divergant opposing sides edges as discussed in connection with FIG. 5. The chevrons make up the major portion of the loop 100-1.

The loop 100-1 (FIG. 9) has first and second legs 202 and 204 made up of linear arrangements of the chevrons 30. First and second turns connect the ends of the legs 202 and 204. These turns may be provided by means such as three-quarter-disk element 206 positioned and aligned so that its side edge 208 and the opposing side edge 16 diverge. In the presence of a rotating magnetic field magnetic bubbles propagate down the leg 202 and up the other leg 204 as indicated by the arrows.

As disclosed in U.S. Pat. No. 4,007,447 of Bobeck, the chevrons in the leg 202 are offset from the chevrons in the leg 204 along the longitudinal axis of movement. Thus the axis 32 of the chevron 30a in the leg 202 bisects the gap between the chevrons 30b and 30c in the leg 204. This interfitting relationship allows the legs 202 and 204 to be spaced closely together without creating a risk that bubbles will jump between the legs. Because of this close spacing of the legs, more loops can be fit within a given chip area. Where the minor loops include chevrons such as 30 (FIG. 5) the period may measure approximately 8 microns and the gap may increase in width from approximately 1.0 microns to approximately 1.25 to 1.5 microns for 2.0 micron bubbles.

Having described preferred embodiments of the present invention, it will be apparent that the invention permits of modification in both arrangement and detail. For example, the minor loops in FIG. 8 can be made of propagation elements other than chevrons so as long as they incorporate the non-uniform gap feature. In addition the propagation paths on the peripheral portions of the chip can be made with the propagation elements of the present invention in order to preserve more chip room for other bubble memory components such as an expander/detector circuit. However, the present invention should be limited only in accordance with the scope of the following claims.

I claim:

1. A magnetic bubble memory comprising:
    means for defining a plurality of minor loops for propagating bubbles therearound;
    means for defining a serial-parallel input path for propagating bubbles to the minor loops and
    means for defining a parallel-serial output path for propagating bubbles from the minor loops;
    the minor loops each including first and second legs made of a plurality of asymmetric chevron propagation elements arranged in side by side consecutive fashion,
    each chevron propagation element having a peak and a pair of poles,
    adjacent chevron propagation elements in a leg having opposing side edges normally defining a gap therebetween extending in the plane of the elements and increasing in width at a predetermined rate moving in a direction away from the poles toward a line intersecting the peaks of the adjacent elements, and
    the predetermined rate of gap width increase being sufficient so that the majority of shorts which occur between adjacent ones of the chevron propagation elements due to fabrication inaccuracies will not create barriers to bubble propagation.

2. A magnetic bubble memory according to claim 1 wherein the side edges of the chevron propagation elements have a curved configuration.

3. A magnetic bubble memory according to claim 1 wherein the side edges of the chevron propagation elements have a saw tooth configuration.

4. A magnetic bubble memory according to claim 1 wherein the gap increases linearly from a width of approximately 1.0 microns to a width of approximately 1.25 to 1.50 microns.

5. A magnetic bubble memory comprising:
    a pattern of elements made of a first magnetic material overlying a film of a second magnetic material to define a path for propagating magnetic bubble domains under the influence of a magnetic bias field and a rotating magnetic drive field,
    the elements each having a pair of poles and a central axis extending between the poles, adjacent ones of the elements having their central axes parallel and having opposing side edges defining a gap therebetween, a first one of the side edges extending parallel to the central axis of its element and a second one of the side edges having major and minor portions extending parallel to the central axis of their element, the minor portion of the second side edge being located adjacent a pole of its element and closer to the first side edge than the major portion of the second side edge.

6. A magnetic bubble memory according to claim 5 wherein the elements are asymmetric chevrons.

7. A magnetic bubble memory according to claim 5 wherein the elements are half-disks.

8. A magnetic bubble memory according to claim 5 wherein the distance between the minor portion of the second side edge and the first side edge is approximately 1.0 microns and the distance between the major portion of the second side edge and the first side edge is approximately 1.25 to 1.50 microns.

9. A magnetic bubble memory comprising:
    a pattern of elements made of a first magnetic material overlying a film of a second magnetic material to define a path for propagating magnetic bubble domains under the influence of a magnetic bias field and a rotating magnetic drive field,
    the elements being configured in the shape of half-disks, each half-disk defining a peak, a pair of poles, and a central axis extending between the poles through the peak, adjacent ones of the elements having opposing side edges defining a gap therebetween, the side edges having a general saw toothed configuration and the gap increasing in width moving in a direction away from the poles toward a line intersecting the peaks of the adjacent elements,
    whereby the majority of shorts which occur between adjacent ones of the elements due to fabrication inaccuracies will not create barriers to bubble propagation.

* * * * *